(12) United States Patent
Larsson

(10) Patent No.: US 8,025,989 B2
(45) Date of Patent: Sep. 27, 2011

(54) COATED CUTTING INSERT

(75) Inventor: Tommy Larsson, Angelsberg (SE)

(73) Assignee: Seco Tools AB, Fagersta (SE)

( * ) Notice: Subject to any disclaimer, the term of this patent is extended or adjusted under 35 U.S.C. 154(b) by 230 days.

(21) Appl. No.: 12/332,874

(22) Filed: Dec. 11, 2008

(65) Prior Publication Data

US 2009/0155558 A1   Jun. 18, 2009

(30) Foreign Application Priority Data

Dec. 14, 2007  (SE) ...................... 0702781

(51) Int. Cl.
*B32B 9/00* (2006.01)

(52) U.S. Cl. ............ 428/697; 51/307; 51/309; 428/216; 428/336; 428/698; 428/699; 428/701; 428/702

(58) Field of Classification Search .................... 51/307, 51/309; 428/216, 336, 697, 698, 699, 701, 428/702

See application file for complete search history.

(56) References Cited

U.S. PATENT DOCUMENTS

| | | | | |
|---|---|---|---|---|
| 5,310,607 | A | | 5/1994 | Schulz et al. ................. 428/697 |
| 5,656,383 | A | * | 8/1997 | Tanaka et al. ................. 428/698 |
| 5,750,247 | A | * | 5/1998 | Bryant et al. ................. 428/336 |
| 5,879,823 | A | | 3/1999 | Prizzi et al. ................... 428/698 |
| 6,062,776 | A | * | 5/2000 | Sandman et al. ............. 428/216 |
| 6,200,671 | B1 | * | 3/2001 | Lindskog et al. ............. 428/699 |
| 6,333,100 | B1 | * | 12/2001 | Palmqvist et al. ............ 428/702 |
| 6,395,379 | B1 | * | 5/2002 | Braendle ....................... 428/697 |
| 6,632,514 | B1 | * | 10/2003 | Sulin et al. .................... 428/216 |
| 6,767,627 | B2 | * | 7/2004 | Morikawa et al. ............ 428/336 |
| 7,097,901 | B2 | * | 8/2006 | Larsson et al. .................. 51/307 |
| 7,132,153 | B2 | * | 11/2006 | Zackrisson et al. ........... 428/698 |
| 7,674,520 | B2 | * | 3/2010 | Schier ........................... 428/701 |
| 7,767,319 | B2 | * | 8/2010 | Åkesson et al. ............... 428/697 |
| 2004/0022662 | A1 | * | 2/2004 | Lipkin et al. .................. 420/528 |
| 2004/0033393 | A1 | | 2/2004 | Nordgren et al. |
| 2004/0121147 | A1 | | 6/2004 | Morikawa et al. ............ 428/336 |
| 2006/0219325 | A1 | | 10/2006 | Kohara |
| 2007/0000772 | A1 | | 1/2007 | Ramm et al. ............. 204/192.38 |

FOREIGN PATENT DOCUMENTS

| | | | |
|---|---|---|---|
| JP | 2002-053946 | * | 2/2002 |
| JP | 2002053945 A | | 2/2002 |
| WO | 9803691 A1 | | 1/1998 |
| WO | 2007/069973 | | 6/2007 |

OTHER PUBLICATIONS

Witthaut et al "Preparation of Cr2O3-Al2O3 Soild Solutions by Reactive Magnetron Sputtering" Mikrochim, Acta 133, p. 191-196, 2000.*

Ashenford et al "Experimental and theoretical studies of low-temperature growth of chromia and alumina" Surface & Coatings Technology, 116-119 p. 699-704, 1999.*

(Continued)

*Primary Examiner* — Archene A. Turner
(74) *Attorney, Agent, or Firm* — Young & Thompson

(57) ABSTRACT

Coated cemented carbide inserts (cutting tools), particularly useful for wet or dry machining of steels and stainless steels, are disclosed. The cutting tool insert is characterized by a cemented carbide substrate and a coating comprising an about 0.5 to 5 μm thick innermost layer of (Ti,Al)N and an about 1 to 5 μm thick layer of $(Al,Cr)_2O_3$.

24 Claims, 1 Drawing Sheet

OTHER PUBLICATIONS

Ramm, J., et al., 'Thermal stability of thin film corundum-type solid solutions of (Al1-xCrx)2O3 synthesized under low-temperature non-equilibrium conditions', Advanced Engineering Materials, vol. 9, No. 7, Jun. 18, 2007, pp. 604-608.

Ramm, et al., 'Pulse enhanced electron emission (P3e(TM)) arc evaporation and the synthesis of wear resistant Al-Cr-O coatings in corundum structure', Surface and Coatings Technology, vol. 202, No. 4-7, May 24, 2007, pp. 876-883.

* cited by examiner

US 8,025,989 B2

COATED CUTTING INSERT

CROSS REFERENCE TO RELATED APPLICATIONS

This application claims priority to Swedish Application No. 0702781-6 filed Dec. 14, 2007, the entire disclosure of which is incorporated herein by reference.

FIELD OF THE INVENTION

This invention relates to coated cemented carbide inserts (cutting tools) particularly useful for wet or dry machining of steels and stainless steels.

BACKGROUND OF THE INVENTION

When machining low and medium alloyed steels and stainless steels with cemented carbide tools, the cutting edge is worn according to different wear mechanisms, such as chemical wear, abrasive wear, and adhesive wear and by edge chipping caused by cracks formed along the cutting edge. The domination of any of the wear mechanisms is determined by the application, and is dependent on properties of the machined material, applied cutting parameters, and the properties of the tool material. In general, it is very difficult to improve all tool properties simultaneously, and commercial cemented carbide grades have usually been optimized with respect to one or few of the above mentioned wear types, and have consequently been optimized for specific application areas.

WO 2007/069973 discloses a coated cutting tool insert particularly useful for dry and wet machining, preferably milling, in low and medium alloyed steels, stainless steels, with or without raw surface zones. The insert is characterized by a WC—TaC—NbC—Co cemented carbide with a W alloyed Co-binder phase and a coating including an innermost layer of $TiC_xN_yO_z$ with columnar grains and a top layer at least on the rake face of a smooth $\alpha$-$Al_2O_3$.

U.S. Pat. No. 5,879,823 discloses a coated cutting tool with a (Ti,Al)N-layer applied by PVD and an alumina layer applied by PVD on top of the (Ti,Al)N-layer.

U.S. Pat. No. 5,310,607 discloses a hard coating including mainly $(Al,Cr)_2O_3$ crystals and a chrome content higher than 5 at % wherein the $(Al,Cr)_2O_3$ is a single crystal. The coating is deposited at a temperature lower or equal to 500° C. The hard coating is deposited by a CVD or PVD process.

What is needed is a coated cutting tool with enhanced performance for machining of steels and stainless steels. The invention is directed to these, as well as other, important needs.

SUMMARY OF THE INVENTION

Accordingly, the invention is directed to cutting tool inserts, comprising a cemented carbide substrate with a wear resisting coating comprising a first, innermost, layer of (Ti,Al)N and a second layer of $(Al,Cr)_2O_3$, particularly useful for wet or dry machining of steels and stainless steels.

In one embodiment, the invention is directed to cutting tool inserts, particularly useful for wet or dry machining of steels and stainless steels, comprising:

a cemented carbide substrate; and
a coating;
wherein said coating comprises:
a first (innermost) layer of $Ti_{1-x}Al_xN$ with about $0.25 \leq x \leq$ about 0.7 with columnar grains and a total thickness of about 0.5-5 µm; and
a layer of $(Al_{1-y}Cr_y)_2O_3$ with about $0.1 \leq y \leq$ about 0.6 with a thickness of about 1-5 µm with columnar grains.

In other embodiments, the invention is directed to methods for machining of steel or stainless steel, comprising the step of:

using a cutting tool insert described herein at cutting speeds of about 75-600 m/min with an average feed, per tooth in the case of milling, of about 0.08-0.5 mm.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

Figure 1:
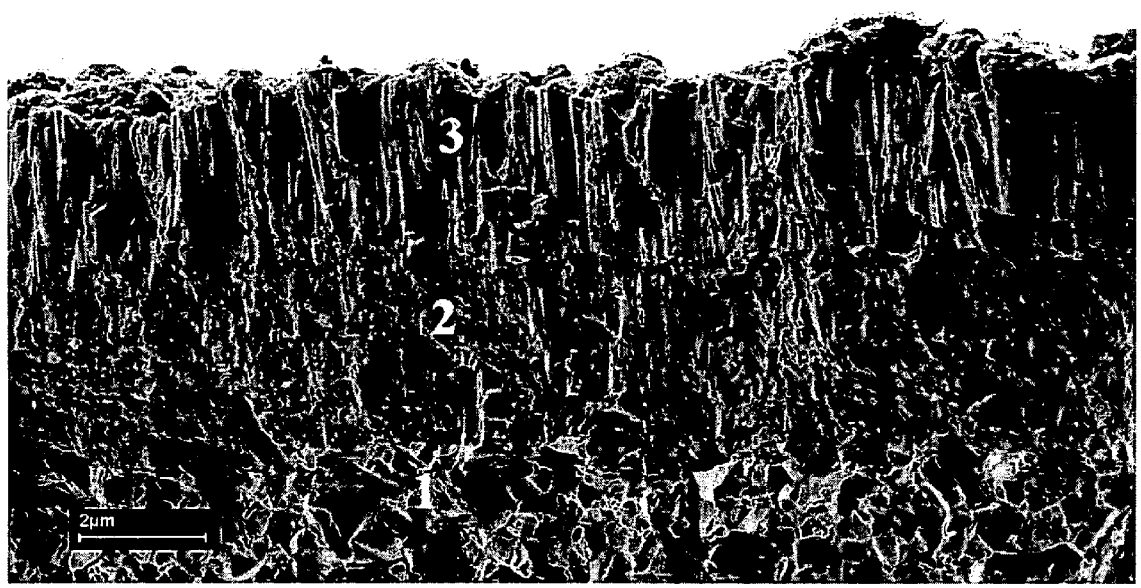
FIG. 1 shows in 20000× a scanning electron microscopy image of a fracture cross section of a cemented carbide insert according to the present invention in which
1. Cemented carbide substrate,
2. Innermost (Ti,Al)N layer and
3. $(Al,Cr)_2O_3$ layer.

The coating deposited on a cemented carbide substrate comprises:

a first (innermost) layer of $Ti_{1-x}Al_xN$ with about $0.25 \leq x \leq$ about 0.7, preferably x>about 0.4, more preferably x>about 0.6, with columnar grains and a total thickness of about 0.5-5 µm, preferably, about 1-4 µm.

a layer of $(Al_{1-y}Cr_y)_2O_3$ with about $0.1 \leq y \leq$ about 0.6, preferably with about $0.3 \leq y \leq$ about 0.55, most preferably y=about 0.5, with a thickness of about 1-5 µm, preferably about 1.5-4.5 µm, more preferably about 2-4 µm, with columnar grains.

In a further alternative embodiment, there is a thin, less than about 1 µm thick, TiN layer on top of the $(Al,Cr)_2O_3$ layer.

In a first embodiment, the cemented carbide substrate has a composition of about 9.3-10.9 wt-% Co, preferably about 9.75-10.7 wt-% Co, more preferably about 9.9-10.5 wt-% Co; about 0.5-2.5 wt-%, about preferably 1.0-2.0 wt-%, more preferably about 1.2-1.8 wt-% total amount of the metals Ti, Nb, and Ta; and balance WC. Ti, Ta, and/or Nb may also be partially or totally replaced by other elements from groups IVb, Vb, or VIb of the periodic table. The content of Ti is preferably on a level corresponding to a technical impurity. Preferably, the ratio between the weight concentrations of Ta and Nb is within about 7.0-12.0, preferably about 7.6-11.4, more preferably about 8.2-10.5. The cemented carbide has a coercivity (Hc) of about 10-15, preferably about 11-14, more preferably about 11.5-13.5 kA/m.

In a second embodiment the a cemented carbide substrate has a composition of about 4.7-5.9 wt-% Co, preferably about 4.9-5.6 wt-% Co, more preferably about 5.0-5.5 wt-% Co; about 5.0-10.0 wt-%, preferably about 6.0-9.0 wt-%, more preferably about 7.0-8.0 wt-% total amount of the metals Ti, Nb and Ta; and balance WC. Ti, Ta, and/or Nb may also be partially or totally replaced by other elements from groups IVb, Vb, or VIb of the periodic table. Preferably, the weight ratio between Ta and Nb is about 1.0-5.0, more preferably about 1.5-4.5. The cemented carbide has a coercivity (Hc) of about 11-17, preferably about 12-16, more preferably about 13-15 kA/m.

A cutting insert according to the invention are made by powder metallurgical technique, wet milling of powders forming hard constituents and binder phase, compacting the milled mixture to bodies of desired shape and size and sintering, comprising a cemented carbide substrate, with compositions according to the above, and a coating comprising a layer of (Ti,Al)N and a layer of $(Al,Cr)_2O_3$.

The layer of (Ti,Al)N is arc-deposited using known technique. The $(Al,Cr)_2O_3$ layer is deposited according to Example 1 in US 2007/0000772.

In an alternative embodiment, a thin, less than about 1 μm, TiN top layer is deposited on the $(Al,Cr)_2O_3$ layer using known techniques.

In a further preferred embodiment, the cutting tool insert as described above is treated after coating with a wet blasting or brushing operation, such that the surface quality of the coated tool is improved.

The invention also relates to the use of cutting tool inserts according to the above for wet or dry milling of steels and stainless steels at cutting speeds of about 75-600 m/min, preferably about 150-500 m/min, with an average feed, per tooth in the case of milling, of about 0.08-0.5 mm, preferably about 0.1-0.4 mm depending on cutting speed and insert geometry.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned hereunder are incorporated herein by reference. Unless mentioned otherwise, the techniques employed or contemplated herein are standard methodologies well known to one of ordinary skill in the art. The materials, methods, and examples are illustrative only and not limiting.

The present invention is further defined in the following Examples, in which all parts and percentages are by weight and degrees are Celsius, unless otherwise stated. It should be understood that these examples, while indicating preferred embodiments of the invention, are given by way of illustration only. From the above discussion and these examples, one skilled in the art can ascertain the essential characteristics of this invention, and without departing from the spirit and scope thereof, can make various changes and modifications of the invention to adapt it to various usages and conditions.

EXAMPLES

Example 1

Grade A: A cemented carbide substrate with the composition 10.3 wt % Co, 1.35 wt % Ta, 0.15 wt % Nb and balance WC, was produced by conventional milling of the powders, pressing of green compacts and subsequent sintering at 1430° C. The Hc value of the cemented carbide was 12.5 kA/m, indicating a mean intercept length of about 0.7 μm. The substrate was coated with a 3.0 μm thick layer of $(Ti_{0.5}Al_{0.5})N$, according to known arc evaporation technique, columnar grains, a 2.9 μm thick layer of columnar $(Al_{0.5}Cr_{0.5})_2O_3$ deposited according to Example 1 in US2007/0000772. FIG. 1 shows in 20000× a scanning electron microscopy image of a fracture cross section of the coated cemented carbide.

Example 2

Grade B: Example 1 was repeated using a carbide substrate with the composition 5.3 wt % Co, 2.0 wt % Ti, 3.4 wt % Ta, 2.0 wt % Nb, and balance WC. The Hc value of the cemented carbide was 13.8 kA/m.

Example 3

Grade C: A layer of 6.0 μm $Ti_{0.33}Al_{0.67}N$ was deposited on the substrates according to Examples 1 and 2 using known arc evaporation techniques.

Example 4

Grades A and C were tested in machining in steel.

| Operation | Face milling |
| --- | --- |
| Cutter diameter | 125 mm |
| Material | SS1672 |
| Insert type | SEEX1204AFTN-M15 |
| Cutting speed | 300 m/min |
| Feed | 0.2 mm/tooth |
| Depth of cut | 2.5 mm |
| Width of cut | 120 mm |

| Results | Tool life (min) |
| --- | --- |
| Grade A (grade according to invention) | 10 |
| Grade C | 8 |

The test was stopped at the same maximum flank wear. The wear resistance was much improved with the grade according to the invention.

Example 5

Grades A and C were tested in machining in stainless steel.

| Operation | Shoulder milling |
| --- | --- |
| Cutter diameter | 32 mm |
| Material | SS1672 |
| Insert type | XOEX120408-M07 |
| Cutting speed | 275 m/min |
| Feed | 0.25 mm/tooth |
| Depth of cut | 3 mm |
| Width of cut | 8.8 mm |

| Results | Tool life (min) |
| --- | --- |
| Grade A (grade according to invention) | 8 |
| Grade C | 5 |

The test was stopped at the same maximum flank wear. The wear resistance was much improved with the grade according to the invention.

Example 6

Grades B and C were tested in machining in stainless steel.

| Operation | Interrupted turning |
|---|---|
| Material | SS2348 |
| Insert type | CNMG120408-MR3 |
| Cutting speed | 80 m/min |
| Feed | 0.3 mm |
| Depth of cut | 2 mm |

| Results | Tool life (cycles) |
|---|---|
| Grade B (grade according to invention) | 5 |
| Grade C | 3 |

The test was stopped at the same maximum flank wear. The wear resistance was much improved with the grade according to the invention.

Example 7

Grades B and C were tested in machining in steel.

| Operation | Interrupted turning |
|---|---|
| Material | SS1672 |
| Insert type | CNMG120408-MR3 |
| Cutting speed | 400 m/min |
| Feed | 0.3 mm |
| Depth of cut | 2 mm |

| Results | Tool life (min) |
|---|---|
| Grade B (grade according to invention) | 13 |
| Grade C | 10 |

The test was stopped at the same maximum flank wear. The wear resistance was much improved with the grade according to the invention.

When ranges are used herein for physical properties, such as molecular weight, or chemical properties, such as chemical formulae, all combinations and subcombinations of ranges specific embodiments therein are intended to be included.

The disclosures of each patent, patent application, and publication cited or described in this document are hereby incorporated herein by reference, in their entirety.

Those skilled in the art will appreciate that numerous changes and modifications can be made to the preferred embodiments of the invention and that such changes and modifications can be made without departing from the spirit of the invention. It is, therefore, intended that the appended claims cover all such equivalent variations as fall within the true spirit and scope of the invention.

What is claimed is:

1. A cutting tool insert, comprising:
a cemented carbide substrate; and
a coating;
wherein said coating comprises:
a first, innermost, layer of $Ti_{1-x}Al_xN$ with about x>about 0.6 to about 0.7 with columnar grains and a total thickness of about 0.5-5 µm; and
a layer of $(Al_{1-y}Cr_y)_2O_3$ with about $0.1 \leq y \leq$ about 0.6 with a thickness of about 1-5 µm with columnar grains,
wherein said cemented carbide substrate has a coercivity of about 10-15 kA/m.

2. A cutting tool insert according to claim 1,
wherein said first (innermost) layer of $Ti_{1-x}Al_xN$ has a total thickness of about 1-4 µm.

3. A cutting tool insert according to claim 1,
wherein about $0.3 \leq y \leq$ about 0.55.

4. A cutting tool insert according to claim 1,
wherein y is about 0.5.

5. A cutting tool insert according to claim 1,
wherein said layer of $(Al_{1-y}Cr_y)_2O_3$ has a thickness of about 1.5-4.5 µm.

6. A cutting tool insert according to claim 1,
wherein said layer of $(Al_{1-y}Cr_y)_2O_3$ has a thickness of about 2-4 µm.

7. A cutting tool insert according to claim 1,
wherein said cemented carbide substrate, comprises:
about 9.3-10.9 wt % Co;
about 0.5-2.5 wt % total amount of cubic carbides of metals selected from the group consisting of Ti, Ta, Nb, and combinations thereof; and
balance $WC_7$.

8. A cutting tool insert according to claim 7,
wherein said cemented carbide substrate comprises about 9.75-10.7 wt % Co.

9. A cutting tool insert according to claim 7,
wherein said cemented carbide substrate comprises about 1.0-2.0 wt % total amount of cubic carbides of the metals of Nb and Ta.

10. A cutting tool insert according to claim 7, wherein said cemented carbide substrate has a coercivity of about 11-14 kA/m.

11. A cutting tool insert according to claim 7,
wherein a weight ratio of Ta and Nb is about 7.0-12.0.

12. A cutting tool insert according to claim 7,
wherein a weight ratio of Ta and Nb is about 7.6-11.4.

13. A cutting tool insert according to claim 1,
wherein said cemented carbide substrate, comprises:
about 4.7-5.9 wt-% Co;
about 5.0-10.0 wt-% total amount of cubic carbides of metals selected from the group consisting of Ti, Ta, Nb, and combinations thereof; and
balance WC.

14. A cutting tool insert according to claim 13,
wherein said cemented carbide substrate comprises about 4.9-5.6 wt-% Co.

15. A cutting tool insert according to claim 13,
wherein said cemented carbide substrate comprises about 5.0-5.5 wt-% Co.

16. A cutting tool insert according to claim 13,
wherein said cemented carbide substrate comprises about 6.0-9.0 wt-% total amount of cubic carbides of the metals of Ti, Ta and Nb.

17. A cutting tool insert according to claim 13,
wherein said cemented carbide substrate comprises about 7.0-8.0 wt-% total amount of cubic carbides of the metals of Ti, Ta and Nb.

18. A cutting tool insert according to claim 13,
wherein said cemented carbide substrate has a coercivity of about 11.5-13.5 kA/m.

19. A cutting tool insert according to claim 13,
wherein said cemented carbide substrate has a coercivity of about 13-15 kA/m.

20. A cutting tool insert according to claim 13,
wherein a weight ratio of Ta and Nb is about 1.0-5.0.

21. A cutting tool insert according to claim 13,
wherein a weight ratio of Ta and Nb is about 1.5-4.5.

22. A cutting tool insert according to claim 1, further comprising a TiN top layer on said $(Al_{1-y}Cr_y)_2O_3$ layer; wherein said TiN top layer is less than about 1 μm thick.

23. A cutting tool insert, comprising:
a cemented carbide substrate; and
a coating;
wherein said cemented carbide substrate, comprises:
   about 4.7-5.9 wt-% Co;
   about 5.0-10.0 wt-% total amount of cubic carbides of metals selected from the group consisting of Ti, Ta, Nb, and combinations thereof; and
   balance WC
wherein said coating comprises:
   a first, innermost, layer of $Ti_{1-x}Al_xN$ with about x>about 0.6 to about 0.7 with columnar grains and a total thickness of about 0.5-5 μm; and
   a layer of $(Al_{1-y}Cr_y)_2O_3$ with about $0.1 \leqq y \leqq$ about 0.6 with a thickness of about 1-5 μm with columnar grains,
wherein said cemented carbide substrate has a coercivity of about 11-14 kA/m.

24. A cutting tool insert according to claim 23, wherein said cemented carbide substrate has a coercivity of about 11.5-13.5 kA/m.

* * * * *